United States Patent [19]

Retsky

[11] Patent Number: 5,825,123
[45] Date of Patent: Oct. 20, 1998

[54] METHOD AND APPARATUS FOR DEFLECTING A CHARGED PARTICLE STREAM

[76] Inventor: Michael W. Retsky, 237 Strobel Rd., Trumbell, Conn. 06611

[21] Appl. No.: 623,918

[22] Filed: Mar. 28, 1996

[51] Int. Cl.⁶ .............................. H01J 29/50; H01J 29/46
[52] U.S. Cl. ........................................... 313/413; 313/444
[58] Field of Search ..................... 313/413, 411, 313/414, 421, 426–27, 428, 432, 434–35, 436–37, 439, 444; 315/14, 15, 27 GD, 22, 382; 348/325–331, 806, 807, 745–47; 350/3.75

[56] References Cited

U.S. PATENT DOCUMENTS

| | | |
|---|---|---|
| 2,108,091 | 2/1938 | Von Ardenne . |
| 2,137,202 | 11/1938 | Federmann . |
| 2,157,303 | 5/1939 | Penrose et al. . |
| 2,191,415 | 2/1940 | Schlesinger . |
| 2,817,044 | 12/1957 | Hinderer . |
| 2,827,592 | 3/1958 | Bramley ............................. 313/432 X |
| 2,905,854 | 9/1959 | Rado . |
| 2,911,557 | 11/1959 | Mollen et al. . |
| 3,142,779 | 7/1964 | Wendt . |
| 3,150,284 | 9/1964 | Comeau .................................... 315/22 |
| 3,185,880 | 5/1965 | Goldberg . |
| 3,205,397 | 9/1965 | Katzmann ........................... 313/414 X |
| 3,772,553 | 11/1973 | Balint et al. . |
| 3,772,566 | 11/1973 | Schwartz ............................. 315/382 X |
| 3,819,984 | 6/1974 | Hawken ......................... 315/27 GD X |
| 3,912,391 | 10/1975 | Fleisher et al. .................... 350/3.75 X |
| 3,949,262 | 4/1976 | Ohkoski . |
| 4,137,479 | 1/1979 | Janko . |
| 4,142,132 | 2/1979 | Harte . |
| 4,201,932 | 5/1980 | Smith ................................. 348/807 X |
| 4,207,492 | 6/1980 | Tomison et al. . |
| 4,249,112 | 2/1981 | McKibben . |
| 4,319,163 | 3/1982 | Chen . |
| 4,574,216 | 3/1986 | Hoeberechts et al. ................... 313/444 |
| 4,682,074 | 7/1987 | Hoeberechts et al. ................... 313/444 |
| 4,728,855 | 3/1988 | Kakizaki . |
| 4,899,091 | 2/1990 | Odenthal . |
| 5,117,152 | 5/1992 | Duwaer et al. . |

OTHER PUBLICATIONS

Retsky, M., "Observed Single Atom Elastic Cross Sections in a Scanning Electron Microscope," Optik, 41:127–142, 1974.

Hilary Moss, "Narrow Angle Electron Guns and Cathode Ray Tubes," Academic Press, NY 1968, p. 113, p. 116.

Schlesinger K., "Progess in the Development of Post–Acceleration and Electrostatic Deflection," Proceedings IRE, p. 659, 1956.

Hutter R.G.E., "Electron Beam Deflection," Part I, J. Appl. Phys., 18:740–758, 1947 and Part II, J. Appl. Phys., 18:797–810, 1947.

Kelly J., "Theoretical Aspects of Electrostatic Electron Beam Deflection," Stanford Research Institute monograph, Aug. 1972.

(List continued on next page.)

Primary Examiner—Sandra L. O'Shea
Assistant Examiner—Mack Haynes
Attorney, Agent, or Firm—Brinks Hofer Gilson & Lione

[57] ABSTRACT

A method and apparatus for deflecting a charged particle stream. The system can include plural vertical and horizontal deflection plates, although a single vertical deflection plate and reference potential plane is preferred. Both orthogonal and preferably tilted display screens are employed to receive the scan. The particle stream is injected offset from a centered position and the stream is scanned asymmetrically away from one deflection plate. A computer program is employed to calculate the offset position. An external quadrupole is employed to correct any aberration in the particle stream. In one embodiment, the system comprises a cathode ray tube.

24 Claims, 5 Drawing Sheets

OTHER PUBLICATIONS

Tsukkerman I., "Electron Optics in Television," Pergamon Press, Oxford, 1961, p. 218.

Kanaya and Baba, "A Method of Correcting the Distorted Spot Shape of a Deflected Electron Probe by Means of Dynamic Focusing and Stigmator," J. Physics D., Sci Instr., 415–426, 1980.

Karssemeijer N. et al., "Spatial Resolution in Digital Mammography," Investigative Radiology, 28:413–419, 1993.

Stix G., "Towards Point One," Sci Am 90–95 Feb. 95.

Schwartz J., "Space Charge Limitation on the Focus of Electron Beams," RCA Review, 18:3 (1957).

Retsky, M. et al., "A New Paradigm for Breast Cancer," University of Colorado, vol. 127, 1993.

METHOD AND APPARATUS FOR DEFLECTING A CHARGED PARTICLE STREAM

An Appendix is included in this application that contains material which is subject to copyright protection. The copyright owner has no objection to the facsimile reproduction by anyone of the Appendix, as it appears in the Patent and Trademark Office patent files or records, but otherwise reserves all copyright rights whatsoever.

BACKGROUND OF THE INVENTION

In electron optics, it is relatively easy to create a small, bright focused spot if the electron beam is not deflected to any great extent. Electron beam probes having a diameter of a few Angstroms are possible, but only within a very small scanned field of a few hundred Angstroms. Most applications of electron beams, however, require moving the beam around appreciably more. When a beam is deflected, aberrations of deflection are induced. These deflection aberrations are usually significant and often much larger than the undeflected focused spot size. As those skilled in the art will appreciate, the above holds equally true for other charged particle streams.

There are two types of image defects that result from deflection. The first is a field defect that distorts rectangles into pincushion or barrel shapes. The second type of defect causes the focused spot to increase in size. The aberrations that cause the focused beam size to increase are of more concern. Depending on the application, an electron beam designer will usually want perimeter or corner resolution to be the same or at least not significantly worse than resolution at the center of focus. Deflection aberrations are approximately proportional to the beam diameter and the square of the deflection angle. Therefore, the designer will often compromise center brightness and resolution in order to make corner resolution and brightness acceptable. This is achieved by reducing the diameter of the beam in the deflection region.

There are two ways to deflect an electron beam— transverse magnetic fields and transverse electric fields. One aberration of concern results from different parts of the beam experiencing different deflections due to inherent nonuniformities of magnetic or electric fields in a vacuum. For the same amount of deflection, the coefficient of deflection aberration is larger for electric field deflection as compared to magnetic field deflection. Electrostatic deflection can be modulated at a very rapid rate and require low power, but electrostatic deflection aberrations can be three times worse than magnetic deflection aberrations. Researchers have tried to reduce electrostatic deflection aberrations since cathode ray tubes first became useful devices early in this century. (Electric field deflection is often called electrostatic deflection whether the activity is static or dynamic.) While some improvements have been demonstrated over the years, a major solution has yet to be satisfactorily identified.

The standard approach to studying deflection aberrations is to approximate solutions to complex integral equations using polynomial expansions of displacement or angle to third and higher order terms. As those skilled in the art will appreciate, these higher order calculations are enormously complicated and typically require equations that fill entire pages. The results of these calculations, however, show that deflection aberrations partially represent quadrupoles, and thus the net effect can be reduced by suitable introduction of another quadrupole of opposite polarity. Correcting quadrupoles are often called stigmators.

A quadrupole produces astigmatism. Astigmatism, unlike most other electron optical aberrations can be either negative or positive. Pure astigmatism can be exactly canceled by another quadrupole of opposite sign disposed elsewhere in the optical stream. The correcting quadrupole could be either magnetic or electrostatic, but should be adjustable in magnitude and orientation. Suitable quadrupole devices are generally known in the art. Quadrupoles can therefore reduce deflection aberrations for both magnetic deflection as well as electrostatic deflection.

In the case of electrostatic deflection, nonuniformities in the deflecting field appear most pronounced near the plate surfaces, and deflection aberrations are considered to be smallest in the exact center between two oppositely charged deflection plates. The distance from the beam to the end of the plates in the direction transverse to deflection is sufficient to prevent edge effect fields from perturbing the deflection. Typically, 0.25 to 0.5 inches is used in the art. Normally, beams are centered between the plates and scanned symmetrically using electrostatic deflection. With one exception, prior known asymmetrical scanning systems have not addressed the correction of deflection aberrations. A different technique on centering symmetry is taught by U.S. Pat. No. 3,185,880, which shows that deflection aberrations are smallest with the beam far offset from center. According to the patent, the beam is offset by more than half the distance from the center to one plate. However, the patent only suggests that smaller geometric focussing errors are achieved as compared to a conventionally centered deflection system. No mention is made of a quadrupole corrector, moreover scanning is performed symmetrically and the deflection plate is flat.

Conventionally, a deflection plate pair has mirror image symmetry so that a plane equidistant between the plates is a virtual equipotential. The voltage of the equipotential is the arithmetic mean of the two plate voltages, or a reference voltage. Placing a reference voltage plate at this virtual equipotential position eliminates the need for the far plate in the case of an offset beam. The reference voltage plate should be longer in extension than the deflection plate, however, because the virtual equipotential plane that it represents is infinite in extent and the fields are strong near the entrance and exit of the plates. Tangential electric fields tend to vanish at the virtual equipotential plane. One advantage to the reference voltage plate arrangement is that only one dynamic deflection voltage is needed rather than two dynamic voltages commonly used with dual plate arrangements. A single deflection voltage simplifies the control electronics considerably.

Many products incorporating electron beams use magnetic deflection rather than electrostatic deflection primarily because of inherently lower deflection aberration coefficients. These products may benefit from electrostatic deflection if only the larger deflection aberrations can be overcome. Other conceivable applications of electron beams exist that are now impractical due to excessive deflection aberrations. Reducing or eliminating the deflection aberrations would make these applications capable of implementation.

For example, a display for digital mammography work stations will eventually replace film-based mammography because of new developments in computer aided diagnosis software, which must operate on digitized images. To convey the same resolution as film, however, requires many more pixels than are currently available on a conventional display. An 8" by 10" mammography scan will require a 4000×5000 pixel matrix, which is twice as demanding (in each dimension) as current magnetically-deflected displays are capable of providing. Another example is in the area of integrated circuit fabrication. One tenth micron feature size is a major design goal for chip manufacturing, but is difficult to accomplish with light optics because of diffraction limitations. Electron beam lithography does not have this limitation at 0.1 micron since the wavelengths are much smaller. Using electron beams to directly expose chips or masks helps to achieve 0.1 micron feature size lines. Because the field must be currently divided into many subfields that are written serially, this procedure takes considerable time. Were it not for deflection aberrations, the entire chip could be written as one field without the interruptions and complications of multiple fields.

The prior art lacks the advantage of electrostatic deflection of a charged particle stream without associated deflection aberrations. Overcoming the deflection aberrations inherent in electrostatic deflection systems would allow for greater resolution and control of the particle stream. Such control provides improved display quality for cathode ray tube displays such as televisions and computer monitors, as well as other uses of charged particle streams.

SUMMARY OF THE INVENTION

In view of the above, the invention provides a method and apparatus for electrostatic deflection of a charged particle stream. According to the method of the invention, the charged particle stream is injected between two symmetrical plates, preferably shaped in a non-linear manner. The stream is injected at a predetermined position offset toward one of the plates from a position equidistant between the two plates. In the preferred embodiment of the invention, the injection offset position is the inflection point obtained from a deflection versus offset curve that is determinable with the use of a preferred computer program. The stream is then scanned asymmetrically away from the near plate with a maximum deflection angle less than half the maximum deflection angle toward the near plate. Voltages are applied to the two deflection plates equally positive and negative respectively relative to the beam or reference voltage in order to deflect the stream. A focus lens and a variable quadrupole are provided prior to deflection, and a target substantially orthogonal to the stream is impacted thereby.

In one aspect of the invention, the deflection aberrations are opposite in effect to the spherical aberration of the focusing lens and thus mitigate the net spherical aberration of the lens. In another aspect of the invention, further reductions in deflection aberrations are achieved by varying the injection offset dynamically with deflection rather than with the use of a static placement for all deflections. The optimum injection offset is obtainable with the preferred computer program.

According to the apparatus of the invention, a source for injecting a charged particle stream is provided. The particle stream is injected between two symmetrical plates, preferably shaped in a non-linear manner. The location of injection is at a predetermined position offset toward one of the plates from a position equidistant between the two plates. In the preferred embodiment of the invention, the injection offset position is the inflection point of a deflection versus offset curve that is determinable with the preferred computer program. Means can be provided for scanning the stream asymmetrically away from a near plate with a maximum deflection angle less than half the maximum deflection angle toward the near plate. A focus lens and a variable quadrupole are provided prior to deflection. Voltages can be applied to the two deflection plates equally positive and negative respectively relative to the beam or reference voltage in order to deflect the stream. A target disposed substantially orthogonal to the stream is provided to receive the stream.

According to one aspect of the invention, a second pair of plates is positioned beyond the initial pair of plates and orthogonal to the original plate pair. This second plate pair is a surface of revolution having a cross-section that is the same as the first plate pair. The center of this surface of revolution corresponds to the extrapolated center of deflection of the particle stream. The second plate pair provides for two-dimensional scanning of the charged particle stream.

In another aspect of the invention, the far deflection plate can be eliminated by replacement with a flat plate located at a position equidistant between the deflection plates and replacing the virtual equipotential equal to the average of the plate voltages. This substitution can apply to either the first deflection plate pair or the second deflection plate pair, or both. The voltage of the flat plate is preferably the equipotential voltage.

According to a further aspect of the invention, the target can be canted or tilted relative to the undeflected stream direction. The preferred cant of the target is such that the center of the scan impacts normal to the target. In one presently preferred embodiment, the target is a phosphorescent screen of a cathode ray tube. Alternatively, the target can be a semiconductor integrated circuit or other suitable impact surface.

A yet further aspect of the invention includes equipotential plates for both pairs of deflection plates so that up to four separate streams can be projected simultaneously. Each stream is optimized to the preferred offset to reduce deflection aberrations, but is separated by the equipotential plates. Each of these independent streams scans a dedicated segment of the target screen, such as a quadrant or half of the screen.

Correcting the deflection aberrations normally produced by electrostatic deflection of a charged particle stream provides greater control of the stream. More precise scanning can thus be achieved. A highly focused and controlled particle stream presents a consistent and well defined spot diameter at the point of impact. Such a highly focused and controlled stream can produce higher definition cathode ray tube assemblies for televisions, computer displays and other video monitors. A charged particle stream with limited or reduced deflection aberration can also be employed in other areas requiring such precision including integrated circuit lithography and video display of mammography images.

These and other features and advantages of the invention will become apparent upon a review of the following detailed description of the presently preferred embodiments of the invention, taken in conjunction with the appended drawings.

DETAILED DESCRIPTION OF THE PRESENTLY PREFERRED EMBODIMENTS

Figure 1:
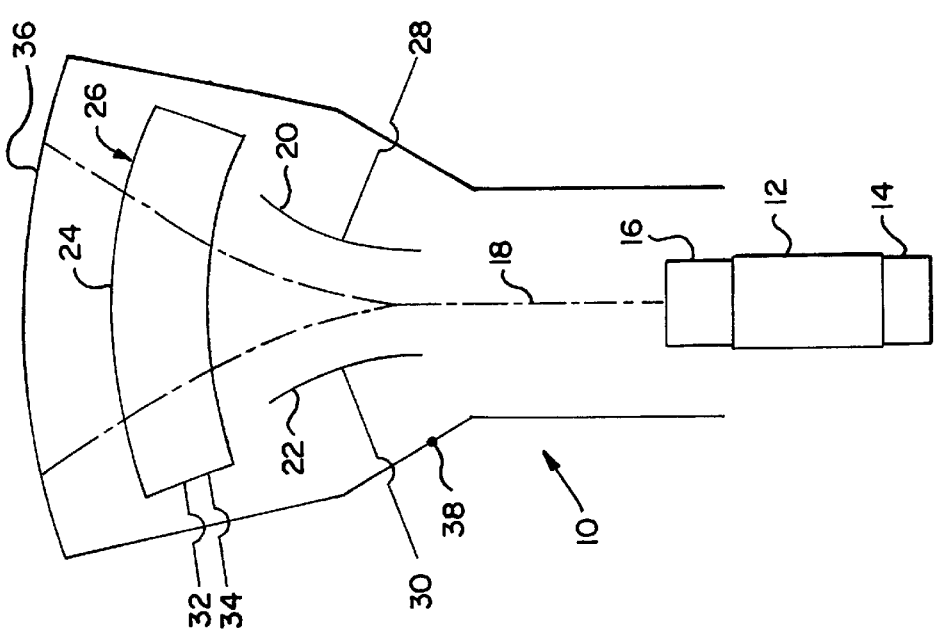
FIG. 1 is a schematic diagram of a conventional cathode ray tube showing the path of an electron stream between pairs of deflection plates.

Referring now to the drawings, where like reference numerals refer to like elements throughout, FIG. 1 shows a conventional cathode ray tube ("CRT") 10. As those skilled in the art will appreciate, the conventional CRT 10 consists of a vacuum enclosure housing beam controlling components. An electron gun 12 included in the CRT 10 for producing a modulated and focusing stream 18 of electrons is comprised of several elements. The electron gun 12 contains a cathode, control grid and accelerator with beam defining aperture 14 from which electrons are emitted, modulated and accelerated. The electron gun 12 also includes a quadrupole and main focus lens 16. The quadrupole is preferably variable rather than fixed, and the quadrupole and main focus lens 16 is disposed prior to the deflection elements (discussed below). The presently preferred quadrupole for use with the invention is described in greater detail below.

Typically, the electron stream 18 produced by the electron gun 12 is injected between a first deflection plate pair 20, 22 and between a second deflection plate pair 24, 26. Although two deflection plate pairs are preferred, as those skilled in the art will appreciate, one or more deflection plates can be employed within the scope of the invention. After injection, the electron stream 18 is deflected by the first pair of deflection plates 20, 22, which can be the horizontal deflection plates of the CRT 10, and then deflected by the second pair of deflection plates 24, 26, which can be the vertical deflection plates of the CRT 10. The degree by which the electron stream 18 is deflected in any direction depends upon the voltage potential of the vertical and horizontal deflecting signals 28, 30 and 32, 34 applied to the vertical and horizontal deflection plates 20, 22, 24 and 26. The plates 20, 22, 24 and 26 therefore deflect the electron stream 18 to impinge as a spot at a predetermined position upon a downstream target. In the preferred CRT 10, the target can be a fluorescent phosphor viewing screen 36, or the like.

The viewing screen 36 is shown in FIG. 1 as being typically mounted orthogonally to the electron gun 12. However, a canted screen 36 is preferred in one embodiment, as explained in more detail below. As those skilled in the art will appreciate, moreover, other display screens or impact surfaces can be employed without departing from the spirit and essential scope of the invention. For example, other impact surfaces can include a semiconductor integrated circuit or the like.

In practical designs, the deflection plate pairs 20, 22 and 24, 26 are often not parallel and are usually closer together at the point of beam entrance to get high deflection sensitivity and then flared open at the point of beam exit to allow clearance of the scanned beam. A multi-segmented or continuously curved plate configuration can be employed. In the preferred embodiment, four segments are used to make up the deflection plates 20–26 (see FIG. 8). Further, to propel the electrons emitted from the gun 12 toward the screen 36, the envelope of the CRT 10 is electrically coupled to an anode voltage 38, as is known in the art.

In order to compensate for deflection aberrations, the invention provides a method and apparatus to focus the particle stream 18 more precisely, which can be used or applied to an improved CRT 10, or other applicable environment. According to the presently preferred embodiment of the invention, a computer program is provided to ray trace the paths of individual electrons in a vacuum and in the vicinity of a pair of electrically charged (simulated) deflection plates. Using the computer program, an optimal deflection design can be determined for any charged particle stream using the principals of the invention.

Figure 2:
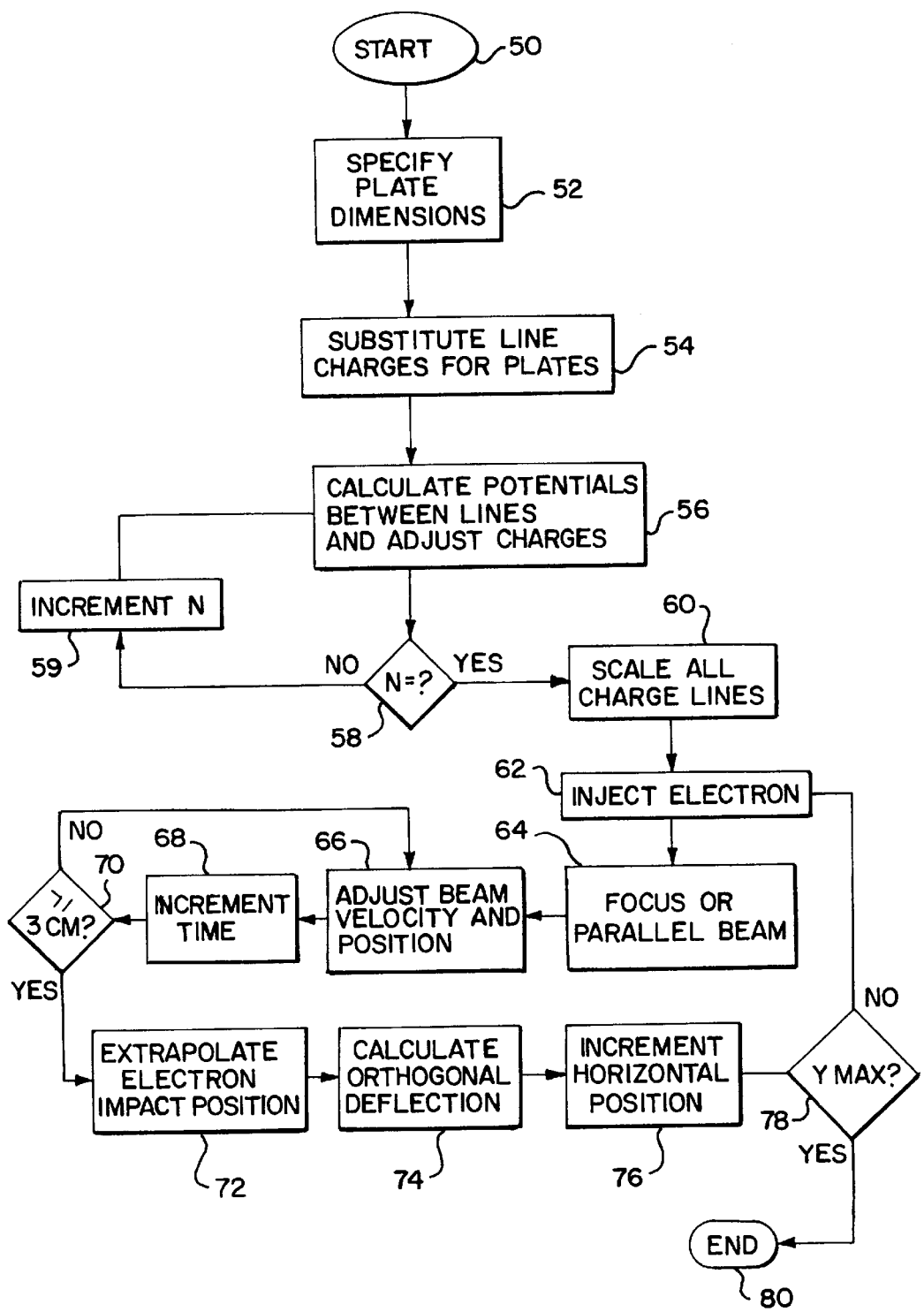
FIG. 2 is a flow chart of one presently preferred method for designing a deflection system according to the invention.

A flow chart showing the steps implemented by the presently preferred computer program is provided in FIG. 2. A computer program written in the FORTRAN computer language that implements the steps shown in FIG. 2 is provided in the Appendix. As those skilled in the art will appreciate, however, the functionality of the invention can be implemented by using any of a plurality of alternative programming languages without departing from the spirit or essential scope of the invention.

Generally, the steps performed by the preferred computer program determine the ideal injection position and scanning of a charged particle stream to compensate for any aberrations of deflection. Because there is no simple analytical expression to describe the electric field in the vicinity of a charged plate, the preferred computer program conceptually replaces the metal deflection plates 20–26 (FIG. 1) with a number of equally-spaced, parallel individual lines of charge. The charge on each line is numerically adjusted by an iterative relaxation process so that the voltage between any two lines is the same. This is done because the voltage remains constant at all points on a conductor when no current is flowing. The program then calculates the charge for each line of charge using a simple model. Once the proper charges on each line of charge are determined, the lines are combined to represent a solid conducting plate. The simulated conducting plates are preferably designed to include up to three bends rather than simple, flat planes.

Using a simple analytical expression for the electric field of a line of charge, the electric field vector at any point in space can be determined as the vector sum of the contributions of all the line charges. As those skilled in the art will appreciate, provisions can be added to the program to increase the number of lines of charge as needed to make the calculation more exact. After several hundred lines per inch, however, no appreciable change is detected in the ray trace results obtained using the preferred program. Thus, an approximation that preferably uses 300 discrete lines of charge to represent one inch long plates is sufficient for the required accuracy.

The preferred ray trace program then follows the path of an electron as it is injected and passed through the simulated deflection plates and on to the point of impact on a simulated display screen. The program "injects" a simulated parallel beam of electrons into this area and detects where each simulated electron eventually impacts the screen. (To fully and rigorously characterize an optical system, oblique rays as well as parallel rays should be studied. However, enough information to design an operable deflection system can be obtained from proper analysis of the paths of parallel particles alone.) The program can be altered slightly to focus the entering beam and determine the spot diameter after deflection. Injecting a parallel beam of electrons into the simulated deflector assembly and properly interpreting where each electron impacts the screen allows for the classification of the deflection aberrations of a prospective electrostatic deflector design. A discussion of the steps performed by the presently preferred ray trace program is provided below.

Referring now to FIG. 2, the presently preferred computer program for implementing the above functions begins execution at step 50. The program then proceeds at step 52 to specify simulated plate shapes, beam voltage, plate voltage, and distance (s2) to a simulated screen. The program preferably performs its calculations in MKS units, but the printout of all output is provided in inches. (Multiplication by "u" in the preferred program converts inches to meters.)

The program can preferably operate in two different modes—parallel rays or focusing rays. At step 54, each plate is replaced with 300 equally spaced (projection on the x axis) parallel lines of charge, the values of each of these individual charges are set at step 54 to an arbitrary initial value that will be adjusted later. The program then calculates at step 56 the potential at a point midway between each of the 300 lines of charge and each of its adjacent lines of charge. A subroutine is preferably called that accepts an x coordinate and returns a y coordinate in accordance with the plate shape. After the first iteration each charge is increased or decreased (step 56) if the potential on each side of the line is too low or too high. The contributions from the 300 lines on each plate are all considered at step 56.

The above process is preferably repeated 100 to 1000 times. After each iteration, the largest fractional error in potential is printed with the corresponding line charge location. A slow but steady decrease in largest fractional error is noted with each additional iteration (step 59). For the example presented below, at the end of 10 iterations the largest fractional error is 0.02; at the end of 50 iterations it is 0.002; after 100 iterations it is 0.0001; and after 1000 iterations the largest fractional error is 0.00001. All charges are then scaled at step 60 so that the potential between any two adjacent lines of charge is acceptably close to the desired value. Taken together, all the line charges can then be used to represent a conducting surface with the specified shape and at the specific voltage.

Beginning at step 62, electrons of an energy level V5 volts are injected one at a time into the gap between the simulated plates. The starting x value (how far before the plate entrance the electron ray trace starts) is set at step 64 to be preferably 1.0 cm (xstart=−0.01). The starting y value and beam width are specified by a do-loop at step 64, and the beam velocity (v) is calculated with a relativistically correct expression. The starting velocity in the y direction (v2) is zero if the rays are injected in a parallel manner (focus=0). If the ray is injected at an angle proportional to the distance from the beam center, the rays are focussed according to the following formula:

$$v=2.9979e8*(1-1/(1+v5/511000)2)0.5$$

$$angle=((start/u-0.125)/0.025)*focus$$

$$v1=v*\cos (angle)$$

$$v2=v*\sin (angle)$$

With the values obtained from the above formula, a beam 0.050 inches wide centered at 0.125 inches offset from the plate pair center is focused toward the simulated screen according to the value of the "focus" variable. The focusing algorithm represents the first order property of a focusing lens. In practice, the best beam focus is numerically determined by varying the value of the "focus" variable and evaluating the resulting variations in beam landing positions using a spreadsheet, or the like. (In the preferred computer program provided in the Appendix, the output files are written with commas separating the fields to readily facilitate importing the data into a spreadsheet.)

The program next calculates electric fields at the current position of each electron. The electric fields from each of the 300 line charges on each plate are summed vectorially. Velocity and position of the electron are adjusted in each time increment (step 66) according to successive integrals of force equals mass times acceleration (e.g., F=mA). The time increment (h) (step 68) preferably varies randomly from electron to electron as a precaution to prevent systematic errors from possible harmonic beating with the lines of charge. While the electron is within the gap between the plates, the clearance to one plate is noted for later printout. If the electron strikes the plate surface, that is also noted and that ray is terminated.

Each ray trace is continued until the electron is 3.0 cm beyond the end of the simulated plate (step 70) at which time a straight line extrapolation is used at step 72 to calculate where the electron would impact the simulated screen. The deflection (s3) and the angle of impact are noted. A center of deflection is calculated at step 74 by extrapolating the ray back to the y=0 axis. Because the usual operation of two-dimensional electrostatic deflection employs two sets of plates oriented in mutually orthogonal directions, the program calculates the orthogonal deflection that would be produced by a second set of plates located 0.5 inches away from the first set of plates. The previously calculated center of deflection of the first set of simulated plates is then used as the center of curvature for the second set of simulated plates. The second set of deflection plates is a surface of revolution with a cross-section having the same shape as the first set of plates. A new electron is then injected at an incremented start value at step 76 and the above ray trace calculations are resumed until the program reaches a predetermined horizontal offset limit at step 78. The program then halts operation at step 80.

By plotting the impact points of each electron with the screen versus the injection position of a beam injected parallel to the center line between the deflection plates, the type of aberration present in a particular CRT design can be determined. If the slope of deflection versus offset is a straight line with slope of one, there would be perfect deflection. That is exact transformation from object to image. With that condition, if a round parallel beam were injected into the deflection area, a round parallel beam would impact the screen, which could then be focused down to a small spot with a good focusing lens. A straight line of slope greater or less than one is typical of what a quadrupole-like aberration would produce. Therefore, a properly designed electrostatic deflection system can be made to produce only quadrupole-like aberrations, which can be corrected by an induced but oppositely charged, quadrupole located prior to deflection as explained below.

A quadrupole employed to counteract or cancel the quadrupole-like deflection aberrations must be of sufficient magnitude, proper orientation and opposite polarity to perform properly. The induced opposing quadrupole can be generated by either an externally or internally mounted coil, or by an internal electrically charged device or the like. The cancelling circuit can be either an electrostatic or magnetically powered device to produce the desired opposing quadrupole and is preferably capable of variable direction and intensity. As those skilled the art will appreciate, other harmonic-like deflection aberrations can be accounted for by the appropriate N-pole compensator.

With an induced quadrupole-like deflection aberration, the deflection process would transform an injected round parallel beam into an elliptical beam at the screen. This elliptically shaped beam could then be focused to a small spot with a focusing lens plus an opposing quadrupole of the type addressed above. As mentioned, the most desirable condition is a linear deflection versus offset plot. If that is not presented by the considered design of the deflection system, the most linear segment of a complex curve would identify the next best location for injection of the electron beam. Typically, that position is at an inflection point 42 along the deflection versus offset curve produced by the preferred computer program.

Figure 3:
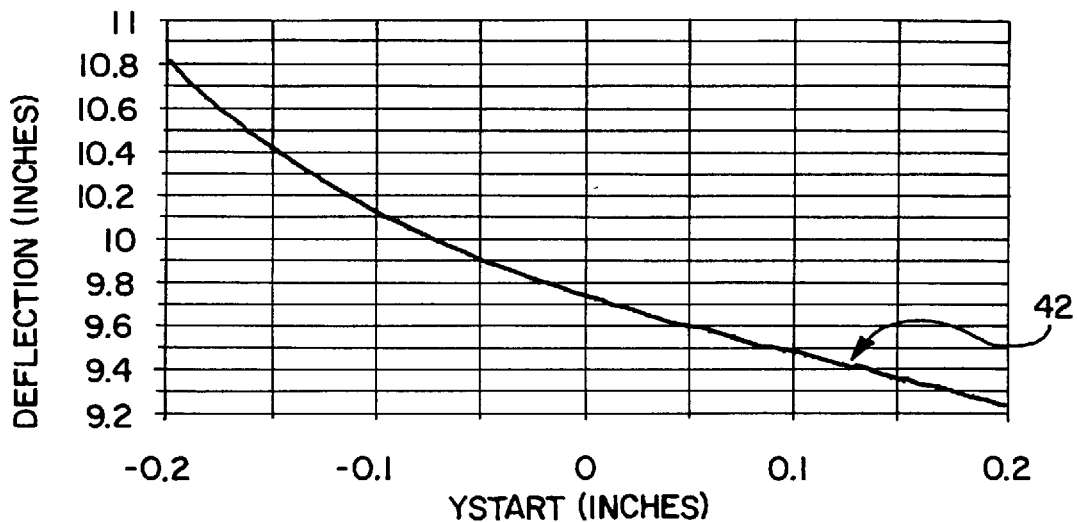
FIG. 3 shows the calculated deflection of individual electrons injected into a one-dimensional deflection system.
Figure 4:
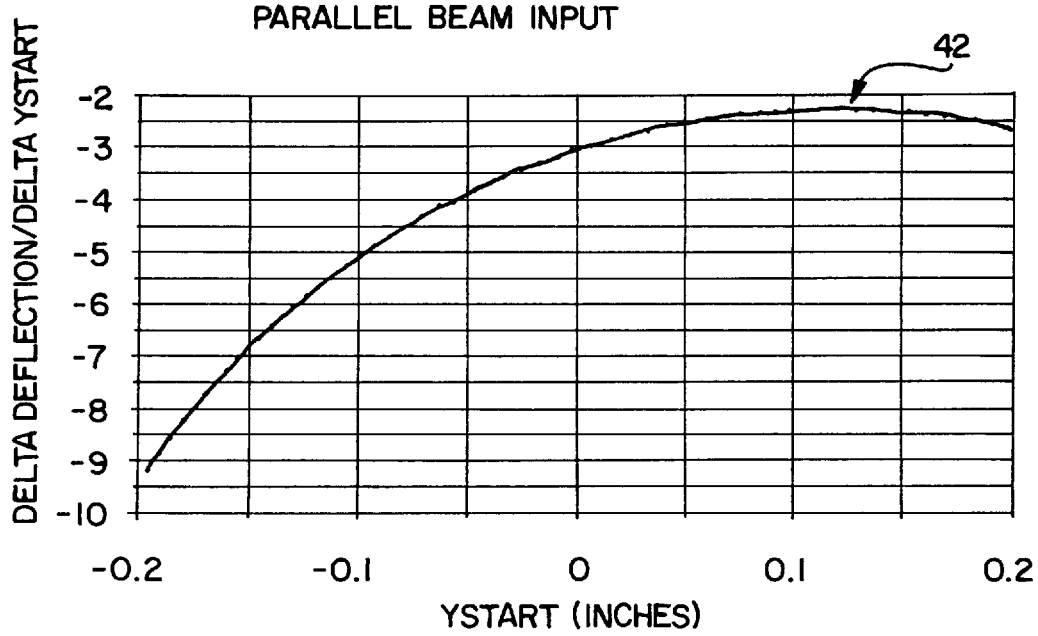
FIG. 4 shows a graph of the derivative values of the data received from FIG. 3.

Referring now to FIG. 3, the deflection versus offset calculation performed by the program provided in the Appendix results in a complex curve that includes an inflection point 42. The mathematical derivative of the curve shown in FIG. 3 is presented in FIG. 4. The derivative plot makes the inflection point 42 more readily observable. The vicinity of this inflection point 42 marks the most linear segment of the deflection versus offset curve and thus indicates where any observed deflection aberrations would be most correctable. Accordingly, the best positioning of a charged particle beam to minimize deflection aberrations in a particular deflection system design is in a position offset from the center line by the value of the inflection point 42. In the example shown in FIGS. 3 and 4, this position appears as slightly less than half the distance from the center line to one deflection plate in the design of the CRT 10. Thus, the electron gun 12 should be positioned to inject the beam 18 at a starting position offset by the value shown by the inflection point 42 with respect to both deflection plate pairs 20, 22 and 24, 26 (see FIG. 8).

Figure 8:
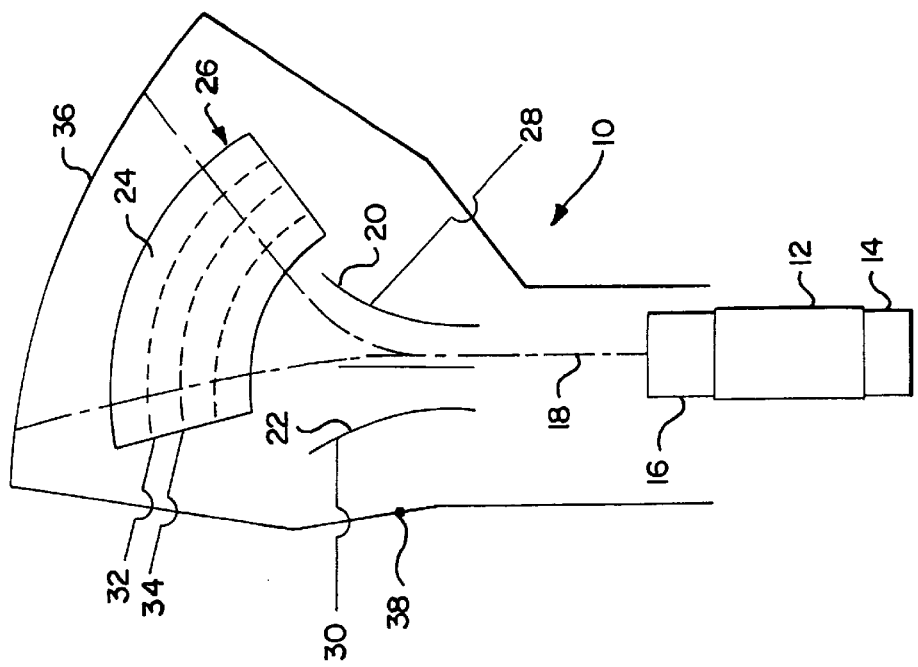
FIG. 8 shows one presently preferred cathode ray tube made according to the principles of the invention.

To further improve the beam and account for any deflection aberrations, the beam can be preferably scanned on the side toward the nearer of two deflection plates. As shown in FIG. 8, the beam 18 is therefore scanned asymmetrically toward the nearest deflection plate of each deflection plate pair 20, 22 and 24, 26 that is closest to the offset position of the electron gun 12. If the beam were scanned symmetrically toward the far plate, the aberrations on that side would be similar to or worse than a normally-centered beam. Thus, deflection aberrations of a target system can be reduced significantly by (1) injecting the beam into the deflection plate gap with a specific off-center displacement that is located at the inflection point 42 of the deflection versus offset curve (see FIG. 3), (2) scanning the beam asymmetrically toward the nearer of two deflection plates, and (3) correcting the residual aberration with a variable quadrupole. Alternatively, performing a full scan towards the near plate and scanning up to approximately 25% away from the near plate still produces significant advantages over the typical symmetrical scan. (To fully scan in both directions, the beam must somehow be redirected to be offset on the opposite side of the centerline as well.) Any induced beam astigmatism can then be corrected using a quadrupole device in the manner described above.

According to one presently preferred embodiment, a reference voltage virtual center plane can also be used, which should extend beyond the deflection plates 20–26 (FIG. 8). In addition, although in the preferred embodiment the driven plate is not flat but curved or segmented, the reference voltage plate should be preferably flat. The use of such a center plate (not shown) allows two to four separate beams to be simultaneously used in the same envelope. That is, multiple beams separated by horizontal and vertical center planes that are separately driven can be used, where each beam is directed to a section of the display screen 36 such as a quadrant, etc.

One example of a deflection design made according to the invention (described below) achieves a 3.9-fold reduction in deflected spot diameter (to a diameter of 0.0011") over a scan field of 9.70"×8.24" on a display screen 36 disposed 12" from the deflection entrance. With a further refinement over a smaller scan field of 6.32"×5.37" at the same 12" screen distance, the deflected spot size can be reduced to the resolution limit of the above calculations (approximately 0.0001" for this case) through a process of dynamically adjusting offset with scan voltage (discussed below). The above proportions can yield as many as 57,400 by 48,800 pixels on a display screen 36 and a corresponding 13-fold reduction in spot diameter.

An optimum CRT design can thus be determined through the calculations performed by the method described above and embodied in the computer program in the Appendix. One example of a low deflection aberration electrostatic deflection system suitable for display of mammography images is presented below.

EXAMPLE
(dimensions are in inches)

| Plate Shade | | |
|---|---|---|
| x | y | Operating Parameters |
| 0 | 0.3 | 20 kv beam voltage |
| 0.2 | 0.34 | −2 to +8 kv deflection plate drive voltage |
| 0.4 | 0.4 | 12.0" plate entrance to screen |
| 0.7 | 0.55 | |
| 1.0 | 0.7 | |

The values shown in the above example were chosen using the preferred computer program to provide reasonable clearance to the scanned beam. Using these parameters, the resulting deflection versus y start for a parallel beam injected into the plate gap with an 8.0 kv potential on the deflection plates is shown in the plot of FIG. 3.

The general shape of the data presented in FIG. 3 is in the format of an S-shaped curve with a subtle inflection point 42 between 0.10 and 0.15 inches. The inflection point 42 detected in FIG. 3 is more obvious in the derivative graph of FIG. 4. As can be better seen in FIG. 4, the inflection point 42 for the above CRT design is located at y start=0.125 inches where there is a reasonably flat section of the curve. Thus, the best offset location for the electron beam 18 in this design should be placed at y=0.125 inches so that a proper lens and quadrupole can be employed to correct the induced deflection aberrations at full scan. Were the beam to be scanned away from the near late, it would be equivalent to centering the beam at y start=−0.125 inches (FIG. 4) and the deflection aberrations would be less correctable.

Figure 5:
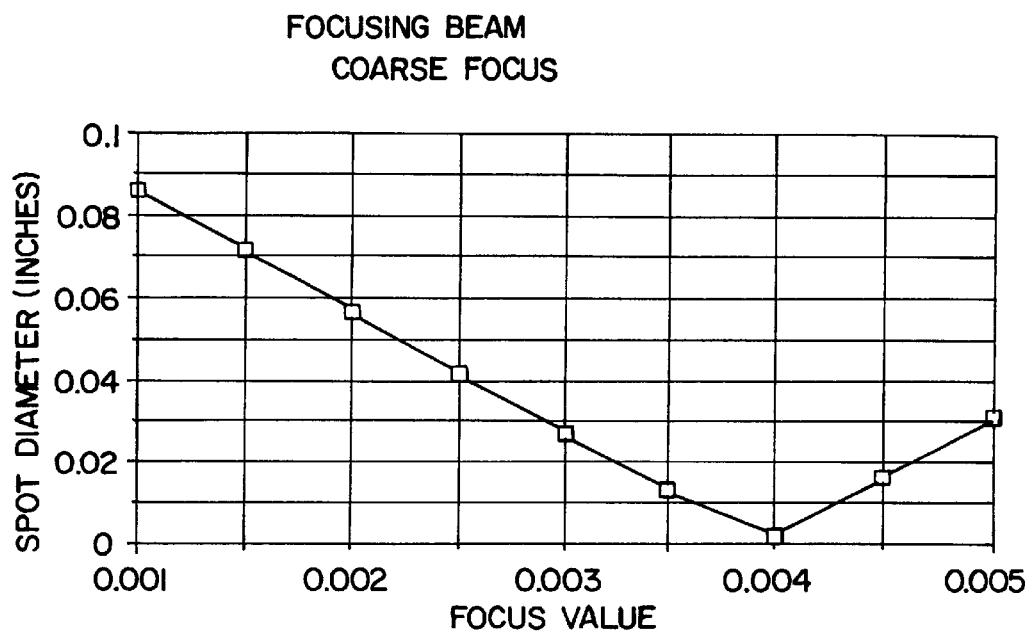
FIG. 5 is a graph showing deflected spot diameter as focus is varied coarsely for an optimally offset beam.
Figure 6:
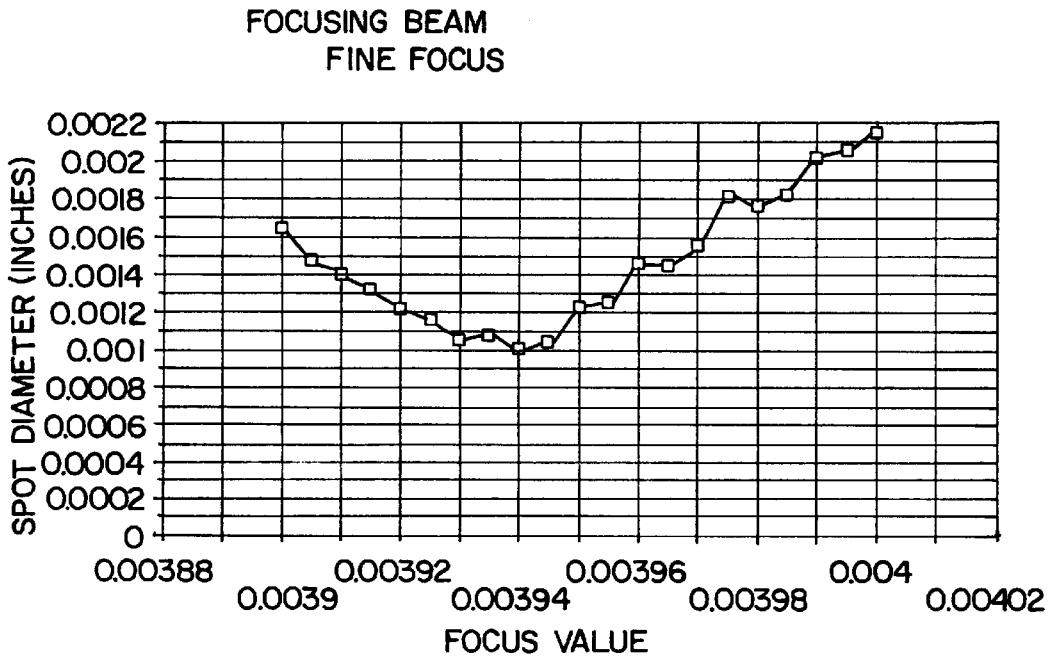
FIG. 6 shows the same illustration as in FIG. 5 where focus is varied finely.

Using the preferred computer program to focus the beam under various conditions confirms the above operations and also confirms that a 0.050 inch wide beam is preferred. Coarse focus variation of the beam is shown in FIG. 5 and fine focus is shown in FIG. 6. With the beam injected off center by 0.125 inches, the focussed spot diameter due to deflection aberrations is less than or equal to 0.0011 inches over the entire field. In the preferred design, the deflection angle is 38.13 degrees toward the near plate and 9.53 degrees away from the near plate for a total scan angle of 47.66 degrees.

Figure 7:
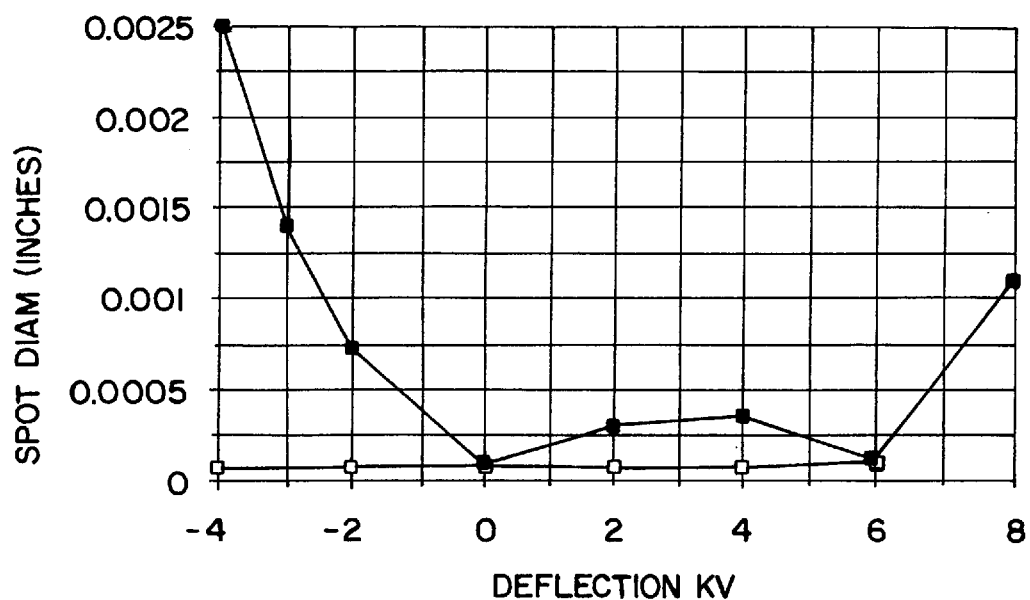
FIG. 7 is a graph showing focused spot diameter versus deflection voltage.

FIG. 7 presents a graph showing the deflection aberration spot diameter versus deflection voltage. Scan limits of −2 kv to +8 kv were chosen to keep the spot diameter less than or equal to 0.0011 inches. As reflected in FIG. 7, the spot diameter for negative deflection voltage can be described by a quadratic equation. The standard measure of fit, $R^2$, is 0.999. The quadratic equation therefore is spot diameter (in inches)=0.000104+0.000149*deflection voltage (in kv) squared. Because it is not a monotonic function of deflection voltage, the variation of spot size with positive deflection voltage is not describable by a quadratic equation. The focused spot diameter at +6 kv is smaller than the spot diameter at +2 kv or +4 kv. This is because the inflection point varies with deflection voltage.

While the inflection point is 0.125 inches with 8 kv deflection voltage, the inflection point changes to 0.160 inches with 4 kv deflection voltage and to 0.210 inches with 2 kv deflection voltage. Thus, the optimum offset position for the election beam depends on the particular scan voltage used. Using the above-described calculations and techniques, zero deflection aberrations are observed over a 30.5 degree scan if the beam offset position is adjusted dynamically as deflection voltage changes.

One presently preferred embodiment of an optimum CRT 10 design is shown in FIG. 8. The display screen 36 shown in FIG. 8 is tilted relative to the deflection assembly so that the center of scan is normal to the screen 36. The full horizontal deflection can be expressed as 24*sin (38.13*1.25/2), or 9.70 inches. The extrapolated center of horizontal deflection is 0.2 inches. The presently preferred four segmented vertical deflection surfaces are also shown in FIG. 8. The resulting calculated vertical deflection is 8.24 inches with 0.5 inches between horizontal and vertical deflection plates. Combining deflection limiting spot size and space charge spot size in quadrature, the resulting spot diameter (at 60 microamps) is 0.00126 inches. The resulting number of pixels that are created thereby is 7682 horizontal pixels by 6722 vertical pixels (scan dimension divided by spot diameter).

Further improvements in deflection system designs can be obtained by also considering gun and source aberrations, which will reduce the number of resolvable pixels. To some extent the spherical aberration of the focusing lens will be compensated by deflection focusing, but that effect has not been considered in the above calculations. Offsetting the beam 0.125 inches from center resulted in a 3.9-fold improvement in focused spot diameter. Some deviations from a linear deflection versus offset design could be tolerated, however. Taking the spherical aberration of the focussing lens into consideration, there is a certain amount of acceptable or even desirable deviation from a straight line plot. Spherical aberration of the lens causes electrons in the outer periphery of a beam to have a shorter focal length as compared to electrons located closer to the center of the beam. This produces the familiar spread in spot diameter at best focus because best focus is a compromise between focusing the central beam electrons as well as the periphery beam electrons. To some degree, therefore, if an aberration of deflection acts to counteract the effect of spherical aberration, it may be acceptable or even desirable. If deflection aberrations result in a slight increase in the focal length of periphery electrons, it may be an acceptable variation from linear deflection versus offset if properly matched to the lens spherical aberration.

The deflection system design described above is suitable for a mammography work station since it can display all the information captured and stored on film with similar precision. With minor alterations, the above design methodology is also applicable to integrated circuit lithography applications. Following the above techniques will allow one of ordinary skill to design a suitable deflection assembly for use with any form of target or impact surface that is purposely impacted by a charged particle stream.

It is to be understood that a wide range of changes and modifications to the embodiments described above will be apparent to those skilled in the art and are contemplated. It is therefore intended that the foregoing detailed description be regarded as illustrative, rather than limiting, and that it be understood that it is the following claims, including all equivalents, that are intended to define the spirit and scope of this invention.

APPENDIX

```
c    @ 1996 Michael W. Retsky, All Rights Reserved.
c    Depending on how program is set up, it will find best
c    offset position of entering beam or best focus and resulting spot
c    diameter. Input includes beam volts, plate volts, plate geometry,
c    distance to screen, beam width and will find best offset.
c    Using 300 lines of charge per inch.
c    Graphical output office\b1 and \b2 show ray relative to plate and
c    E1,E2 vs xaxis and v2/v1 vs xaxis
c    \b3 has ystart,deflection . . . \b4 has plate information and volts.
c    Language is Fortran 77 from Lahey Computer Systems, 702-831-2500
     common q(300), x0, y0, x1, y1, x2, y2, x3, y3, x4, y4, x6, y6, x8, y8, x9, y9
     open(1, 'C:\office\b1.txt', access = 'sequential', status='old')
     open(2, 'C:\office\b2.txt', access = 'sequential', status='old')
     open(3, 'C:\office\b3.txt', access = 'sequential', status='old')
     open(4, 'C:\office\b4.txt', access = 'sequential', status='old')
     open(5, 'C:\office\b5.txt', access = 'sequential', status='old')
c    For first use of this program, insert "new" instead of "old".
     ak1=(1.6e-19)/(9.1e-31)
c    ak1 is e/m. If charged particles other than electrons are used,
c    ak1 must reflect proper charge to mass ratio.
     u= 2.54/100
c    Mult by u converts inches to meters, divide by u converts m to in.
c    Program runs in MKS units but print out is in inches.
c    Plate shape (x0,y0) is beginning and (x4,y4) is end.
     y0=u*.3
     y1=u*.34
     y2=u*.4
     y3=u*.55
     y4=u*.7
```

APPENDIX-continued

```
            x0=0
            x1=.2*u
            x2=.4*u
            x3=.7*u
            x4=1.0*u
    c     s2 is distance to screen
            s2=12.0*u
            pout=0
    c       pout = 0 for no long ray trace write file to be made
    c       pout = 1 will write the long ray trace file
            rando=rrand()
    c       h will be randomized to eliminate harmonic interaction with
    c         lines of charge
            delta = .005
            v5=20000
            em8 = -3000
    c         delta is offset increment, v5 is beam voltage, em8 is plate volts.
            s3=10*u
    c         just an initial value for s3 not critical for anything later
            em0=0
            em1=0
            em2=0
            em3=0
            em4=0
            g0=0
            g1=0
            g2=0
            g3=0
            g4=0
            n0=100
    c       n0 is the number of iterations to settle charges on plates
    c       n0 = 1000 gives almost 5 digit smoothness 2743xx +/- 1x or so
    c       Use n0 = 100 to 1000 for normal computations.
            print*, "0          ",x0/u,y0/u," This"
            print*, "1          ",x1/u,y1/u,"   is"
            print*, "2          ",x2/u,y2/u,"   the"
            print*, "3          ",x3/u,y3/u,"       plate"
            print*, "4          ",x4/u,y4/u,"           shape."
            print*, " "
            n=0
            do 100 i=1,300
              q(i)=3000
    100   continue
    c       f0 is max deviation of potential between charges
    c       from potential found at end of 1st iteration
    c       charges are not adjusted until second iteration
            print *, "iteration"," largest error"," at"
    101   f0=0
            do 110 j=1,299
              x=(j-.5)*x4/299
              x6=x
              call y6ofx6
    c       y6ofx6 finds y6(x6) for top plate. There are 300 charges on
    c       each plate. The first, q(1) is at x=0 and the last is at x=x4.
    c       Interval is x4/299.
    c       Potential is calculated between each charge and its
    c       nearest neighbors on each side. Charges are adjusted by a
    c       factor larger than the error to speed convergence.
              y=y6
              p=0
              do 120 i=1,300
                x7=(i-1)*x4/299
              x6=x7
              call y6ofx6
              y7=y6
              r=((x-x7)**2+(y-y7)**2)**.5
              r1=((x-x7)**2+(y+y7)**2)**.5
              r1=1/r1
              r=1/r
              p=p+q(i)*(alog)(r)-alog(r1))
    c       p is potential at (x,y) due to all the charges at (x7,y7)
    120       continue
    c       no adjustment is made during n=0 calculations
              if (n .le. .5) then
                p4=p
              endif
              f1=(p4-p)/p4
              if ((f1**2) .ge. (f0**2)) then
                f0=f1
```

APPENDIX-continued

```
              j1=j
          endif
          q(j)=q(j)*(f1*3.8+1)
          q(j+1)=q(j+1)*(f1*3.8+1)
          if ((n+1) .ge. n0) then
c             print *,j,p
          endif
110     continue
        n=n+1
        print *,n,f0,j1
c       n is relaxation iteration number, f0 is worst fractional error at
c       line-charge   number j1
        if (n .1t. n0) then
            goto 101
        endif
        do 150 i=1, 300
            q(i)=q(i)*em8/p4
c       previous statement is only place where plate voltage appears
150         continue
180         continue
c       Following "do 158" statement is used when finding best focus.
c       Or if focus is set to zero, then al entering rays are parallel.
c       Use one way or the other. Need to also adjust the beam width.
        do 158 focus = -.01, .02000, .0005
c       focus = 0
        print *, "beam, plate, focus: ", v5, em8., focus
        print *, " "
c       now begins the ray tracing part
c       h is time interval in seconds of ray trace
182         continue
        s4=s3
        c3=1
        c4=u
c       next steps give starting position of electron
        n6=0
        do 155 ystart = 0.100*u,.15001*u,.delta*u
        y = ystart
        xstart = -.01
        x = xstart
        rando=rnd()
        h=(.5 +rando*.3.)*1e-13
        n6=n6+1
        print *, " "
        print *, "start at ",x/u,y/u," h is",h
c       next step is starting velocity m/sec relativistically correct
151     v=2.9979e8*(1-1/(1+v5/511000)**2)**.5
        angle = (.(ystart/u-.125)/.025) * focus
        v1 = v * cos(angle)
        v2 = v * sin(angle)
        print *, "injection v2/v1 is ", v2/v1
c       next program calculates fields E1 and E2 at x,y due to lines of
c       charge at x7, +/- y7
        continue
        e1=0
        e2=0
        do 152 i=1,300
            x6=(i-1)*x4/299
            call y6ofx6
            x7=x6
            y7=y6
            r3=(x-x7)**2+(y-y7)**2
            r4=(x-x7)**2+(y+y7)**2
            E1=e1+q(i)*(x7-x)*(1/r3-1/r4)
            E2=e2+q(i)*((y7-y)/r3+(y7+y)/r4)
152         continue
        v1=v1+e1*h*ak1
        v2=v2+e2*h*ak1
        x=x+v1*h
        y=y+v2*h
        if (pout .1t. .5) then
            goto 169
        endif
c       above goto 169 will skip long write and print of raytrace
        if (x .gt. x4) then
            write (1,*) E1, ', ', E2, ', ', v2/v1, ', ', x/u, ', ', y/u
                write (2,*) x/u, ', ', y/u, ', ', 1
            goto 169
        endif
        if (x .1t. 0) then
```

APPENDIX-continued

```
                 write (1,*) E1, ', ', E2, ', ', v2/v1, ', ', x/u, ', ', y/u
                    write (2,*) x/u, ', ', y/u, ', ', 1
                    goto 169
             endif
                x6=x
                call y6ofx6
                write (1,*) E1, ', ', E2, ', ', v2/v1, ', ', xu, ', ', y/u
                write (2,*) x/u, ', ', y/u, ', ', y6/u
169          continue
             if (x *.gt. x4) then
                    goto 153
             else if (x .lt. 0) then
                    goto 153
             endif
             x6=x
             call y6ofx6
             c4=y6-y
             if (c4 .ge c3) then
                    goto 154
             endif
             c3=c4
             d3=x
154          if (y .ge. y6) then
                    print *, "hit plate at ,", x/u
                       write (4,*) 'hit plate at ,', x/u
                       goto 155
             endif
153          if (x .gt. x4+.03) then
                    goto 156
             endif
176          continue
             if (x .lt x0) then
                    goto 160
             endif
             if (g0 .gt. .5) then
                    goto 161
             endif
             em0=c4
             g0=1
161          if (x .lt. x1) then
                    goto 164
             endif
             if (g1 .gt. .5) then
                    goto 164
             endif
             em1=c4
             g1=1
164          if (x .lt. x2) then
                    goto 162
             endif
             if (g2 .gt. .5) then
                    goto 162
             endif
             em2 =c4
             g2=1
162          if (x .lt. x3) then
                    goto 163
             endif
             if (g3 .gt. .5) then
                    goto 163
             endif
             em3=c4
             g3=1
163          if (x .lt. x4) then
                    goto 160
             endif
             if (g4 .gt. .5) then
                    goto 160
             endif
             em4=c4
             g4=1
160          continue
             goto 170
156          t4=v2/v1
171          continue
             print *, "distance to screen is", s2/u
             s3=y+t4*(s2-x)
             print *, "electron landed at deflection of ", s3/u
             print *, "at an angle of ", atan (t4)
```

APPENDIX-continued

```
          write (3,*) ystart/u, ', ', s3/u, ', ', atan(t4), ', ',focus
183       continue
          s5=s3-s4
172       continue
          s4=s3
          s5 = abs(s5/(delta*u))
185       continue
          s6=s2-s3*v1/v2
          print *, "extrapolated center of 1st deflection is ",s6/u
          s7=(s2-x4-.5*u-s6)*v2/v1
c         allows for half inch between 1st and 2nd deflection plates
          print *, "vertical deflection is ",s7/u
          print *, "closest approach to plate is",c3/u," at x= ",d3/u
          print *, "position       x         y          clearance"
          print *,
          print *, "entrance      ",x0/u,y0/u,em0/u
          print *, "first bend ",x1/u,y1/u,em1/u
          print *, "second bend",x2/u,y2/u,em2/u
          print *, "third bend ", x3/u,y3/u,em3/u
          print *, "exit          ",x4/u,y4/u,em4/u
177       continue
          em0=0
          em1=0
          em2=0
          em3=0
          em4=0
          g0=0
          g1=0
          g2=0
          g3=0
          g4=0
155       continue
158       continue
          end
          subroutine y6ofx6
          common q(300), x0, y0, x1, y1, x2, y2, x3, y3, x4, y4, x6, y6, x8, y8, x9, 9
          if (x6 .gt. x3) then
                goto 135
          else if (x6 .gt. x2) then
                goto 136
          else if (x6 .gt. x1) then
                goto 137
          endif
          y8=y0
          x8=x0
          y9=y1
          x9=x1
          goto 138
135       y8=y3
          x8=x3
          y9=y4
          x9=x4
          goto 138
136       y8=y2
          x8=x2
          y9=y3
          x9=x3
          goto 138
137       y8=y1
          x8=x1
          y9=y2
          x9=x2
          goto 138
138       if (x8 .eq. x9) then
                goto 139
          endif
          y6=(x6-x8)*(y8-y9)/(x8-x9)+y8
          goto 140
139       y6=y8
140       end
```

I claim:

1. Apparatus for deflecting a charged particle stream by injecting the stream between a first pair of symmetrical deflection plates, comprising:

a particle source, the particle source operative to aim the particle stream in a substantially undeflected condition offset from a centerline between the symmetrical deflection plates, the offset position being at a predetermined location based upon stream deflection and stream offset characteristics, wherein the predetermined location comprises an inflection point on a deflection versus offset curve; and a target disposed substantially orthogonal to the particle stream the particle stream to impact the target.

2. Apparatus for deflecting a charged particle stream by injecting the stream between a first pair of symmetrical deflection plates, comprising:

a particle source, the particle source operative to aim the particle stream in a substantially undeflected condition offset from a centerline between the symmetrical deflection plates, the offset position being at a predetermined location based upon stream deflection and stream offset characteristics;

a flat plate placed at an equipotential plane midway between the first pair of symmetrical deflection plates, wherein the potential of the flat plate is substantially the equipotential voltage; and a target disposed substantially orthogonal to the particle stream, the particle stream to impact the target.

3. Apparatus for deflecting a charged particle stream by injecting the stream between a first pair of symmetrical deflection plates, comprising:

a particle source, the particle source operative to aim the particle stream in a substantially undeflected condition offset from a centerline between the symmetrical deflection plates, the offset position being at a predetermined location based upon stream deflection and stream offset characteristics;

a second pair of symmetrical deflection plates disposed beyond the first pair of symmetrical deflection plates and orthogonal to the first plate pair wherein the particle stream is injected at a position offset from a centerline between the second plate pair;

a flat plate placed at an equipotential plane midway between the second pair of symmetrical deflection plates, wherein the potential of the flat plate is substantially the equipotential voltage; and a target disposed substantially orthogonal to the particle stream, the particle stream to impact the target.

4. Apparatus for deflecting a plurality of separate charged particle streams by injecting the streams between a first pair of symmetrical deflection plates, comprising:

at least one particle source, the at least one particle source operative to aim at least one particle stream in a substantially undeflected condition offset from a centerline between the symmetrical deflection plates, the offset position being at a predetermined location based upon stream deflection and stream offset characteristics;

a flat plate placed at an equipotential plane midway between the first pair of symmetrical deflection plates, wherein the potential of the flat plate is substantially the equipotential voltage; and a target disposed substantially orthogonal to the at least one particle stream, the at least one particle stream to impact the target on one side of the equipotential plane and scanning a dedicated section of the target.

5. Apparatus for electrostatically deflecting a charged particle beam, comprising:

a variable quadrupole and focus lens coupled to receive first and second deflection voltages, the variable quadrupole and focus lens to dynamically adjust beam astigmatism and focus the beam according to the first and second deflection voltages;

a first particle deflection plate;

means for scanning the beam asymmetrically away from the first particle deflection plate with a maximum deflection angle less than half the maximum deflection angle required to deflect the beam toward the first particle deflection plate; and a target disposed substantially orthogonal to the particle beam, the target to receive the beam.

6. The apparatus defined in claim 5, further comprising means for injecting the beam at an offset position.

7. The apparatus defined in claim 6, further comprising a second particle deflection plate disposed orthogonally to the first particle deflection plate, wherein the beam is scanned asymmetrically away from the second particle deflection plate.

8. A method of electrostatically deflecting a charged particle beam comprising the steps of:

injecting the beam between two symmetrical deflection plates at a position offset from a centerline between the plates, the offset position being at a predetermined location based upon beam deflection and beam offset characteristics, wherein the predetermined location comprises an inflection point on a deflection versus offset curve;

dynamically adjusting any beam astigmatism and focusing the beam prior to deflection; and impacting a target disposed substantially orthogonal to the particle beam.

9. A method for electrostatically deflecting a charged particle beam, comprising the steps of:

providing a variable quadrupole and focus lens coupled to receive first and second deflection voltages, the variable quadrupole and focus lens to dynamically adjust any beam astigmatism and focus the beam;

providing a particle deflection plate;

scanning the beam asymmetrically away from the particle deflection plate with a maximum deflection angle less than half the maximum deflection angle required to deflect the beam toward the particle deflection plate; and impacting a target disposed substantially orthogonal to the particle beam.

10. The method defined in claim 9, further comprising the step of injecting the beam at a position offset from a centerline.

11. A cathode ray tube having an electron beam injected between first and second symmetrical deflection plates, comprising:

an electron source, the electron source for generating an electron beam at a position offset from a centerline between the first and second symmetrical deflection plates, the offset position being an inflection point on a deflection versus offset curve;

a variable quadrupole and focus lens disposed between the electron source and the first and second symmetrical deflection plates and coupled to receive plural deflection voltages, the variable quadrupole and focus lens to dynamically adjust any electron beam astigmatism and focus the beam;

means for scanning the beam asymmetrically away from the first deflection plate with a maximum deflection angle less than half the maximum deflection angle required to deflect the beam toward the first deflection plate; and a display screen disposed substantially orthogonal to the electron beam, the display screen to provide illumination about a point of impact of the electron beam.

12. The cathode ray tube defined in claim 11, wherein the display screen comprises a phosphorescent display.

13. The cathode ray tube defined in claim 11, wherein the display screen is canted at an angle with respect to the electron beam such that the center of the scan is normal to the display screen.

14. The cathode ray tube defined in claim 11, wherein the electron source comprises an electron gun having a cathode, control grid and accelerator with beam defining aperture.

15. The cathode ray tube defined in claim 11, further comprising a second pair of deflection plates disposed beyond the first and second symmetrical deflection plates and orthogonal to the first and second deflection plates, the second pair of deflection plates having a surface of revolution with cross-section substantially the same as the first and second symmetrical deflection plates.

16. The cathode ray tube defined in claim 11, wherein the electron beam comprises a plurality of electron beams.

17. The cathode ray tube defined in claim 16, wherein the plurality of electron beams comprises four beams each beam being directed to a respective quadrant of the display screen.

18. The cathode ray tube defined in claim 11, further comprising a flat plate placed at an equipotential plane midway between the first and second symmetrical deflection plates, wherein the potential of the flat plate is substantially the equipotential voltage.

19. The cathode ray tube defined in claim 11, wherein the first and second symmetrical deflection plates are non-linear.

20. The cathode ray tube defined in claim 11, wherein the quadrupole comprises an external magnetic quadrupole.

21. Apparatus for deflecting an electron stream between a near plate and a far plate, the plates being symmetrical, comprising:

means for injecting the electron stream at a position offset from a centerline between the near and far plates;

means for scanning the electron stream at an angle away from the near plate, the angle being less than half the angle required to deflect the stream toward the near plate;

means for dynamically adjusting the focus of the electron stream; and means for correcting deflection aberrations in the electron stream.

22. The apparatus defined in claim 21, wherein the means for injecting comprises an electron gun.

23. A method of deflecting an electron stream between a near plate and a far plate, the plates being symmetrical, comprising the steps of:

injecting the electron stream at a position offset from a centerline between the near and far plates;

scanning the electron stream at an angle away from the near plate, the angle being less than half the angle required to deflect the stream toward the near plate;

dynamically adjusting the focus of the electron stream; and providing an external magnetic quadrupole, the external quadrupole for correcting deflection aberrations in the electron stream.

24. The method defined in claim 23, wherein the step of providing an external quadrupole comprises providing a variable quadrupole.

* * * * *

UNITED STATES PATENT AND TRADEMARK OFFICE
CERTIFICATE OF CORRECTION

PATENT NO.    : 5,825,123
DATED         : October 20, 1998
INVENTOR(S)   : Michael W. Retsky It is certified that error appears in the above-identified patent and that said Letters Patent is hereby corrected as shown below:

Column 21,
Line 30, please change "plate pair wherein" to -- plate wherein --.

Signed and Sealed this

Seventeenth Day of August, 2004

JON W. DUDAS
*Acting Director of the United States Patent and Trademark Office*